(12) United States Patent
Vashi

(10) Patent No.: US 12,609,545 B2
(45) Date of Patent: Apr. 21, 2026

(54) BATTERY CHARGER WITH COOLING AND SEALING CONSTRUCTION

(71) Applicant: MILWAUKEE ELECTRIC TOOL CORPORATION, Brookfield, WI (US)

(72) Inventor: Bhaumik M. Vashi, Milwaukee, WI (US)

(73) Assignee: Milwaukee Electric Tool Corporation, Brookfield, WI (US)

( * ) Notice: Subject to any disclaimer, the term of this patent is extended or adjusted under 35 U.S.C. 154(b) by 723 days.

(21) Appl. No.: 18/081,023

(22) Filed: Dec. 14, 2022

(65) Prior Publication Data

US 2023/0187952 A1 Jun. 15, 2023

Related U.S. Application Data

(60) Provisional application No. 63/289,794, filed on Dec. 15, 2021.

(51) Int. Cl.
| | |
|---|---|
| *H01M 10/46* | (2006.01) |
| *H01M 10/42* | (2006.01) |
| *H01M 10/44* | (2006.01) |
| *H02J 7/70* | (2026.01) |
| *H05K 7/20* | (2006.01) |

(52) U.S. Cl.
CPC ........... *H02J 7/731* (2026.01); *H01M 10/425* (2013.01); *H01M 10/443* (2013.01); *H02J 7/751* (2026.01); *H05K 7/2039* (2013.01); *H05K 7/209* (2013.01)

(58) Field of Classification Search
CPC ........ H02J 7/0044; H02J 7/209; H02J 7/2039; H02J 7/0042; H02J 7/0045; H02J 7/751; H02J 7/731; H01M 10/443; H01M 10/44; H01M 10/46; H01M 10/425; H05K 7/209; H05K 7/2039

USPC ................. 320/107, 111, 114, 115, 150, 153
See application file for complete search history.

(56) References Cited

U.S. PATENT DOCUMENTS

| | | | |
|---|---|---|---|
| 8,564,242 | B2 | 10/2013 | Hansford et al. |
| 9,142,992 | B2 | 9/2015 | Malackowski et al. |
| 9,153,985 | B1 | 10/2015 | Gjøvik et al. |
| (Continued) | | | |

FOREIGN PATENT DOCUMENTS

| | | |
|---|---|---|
| CN | 212627220 U | 2/2021 |
| JP | 2018196240 A | 12/2018 |
| (Continued) | | |

OTHER PUBLICATIONS

International Search Report and Written Opinion for Application No. PCT/US2022/052812 dated May 1, 2023 (11 pages).

(Continued)

*Primary Examiner* — Edward Tso
(74) *Attorney, Agent, or Firm* — Michael Best & Friedrich LLP

(57) ABSTRACT

A charger for use with a rechargeable battery includes a housing, electrical components, a connector port, a heatsink, and thermally conductive filler material. The housing includes a battery interface slidably receiving the rechargeable battery. The electrical components are disposed in the housing. The electrical components generate heat. The connector port is electrically coupled to the electrical components. The heatsink is disposed in the housing. The heatsink includes a cavity. The thermally conductive filler material at least partially fills the cavity. The thermally conductive filler material contacts both the electrical components and the heatsink.

17 Claims, 5 Drawing Sheets

(56) References Cited

U.S. PATENT DOCUMENTS

| | | | |
|---|---|---|---|
| 9,419,462 | B2 | 8/2016 | Sollanek |
| 9,496,536 | B2 | 11/2016 | Yoshinari et al. |
| 10,523,018 | B2 | 12/2019 | Stacey et al. |
| 10,601,236 | B2 | 3/2020 | Seidel et al. |
| 10,630,088 | B2 | 4/2020 | Seidel et al. |
| 10,674,618 | B2 | 6/2020 | Choksi et al. |
| 2007/0090788 | A1 | 4/2007 | Hansford et al. |
| 2007/0244471 | A1 | 10/2007 | Malackowski |
| 2011/0074362 | A1 | 3/2011 | Midorikawa |
| 2014/0117922 | A1 | 5/2014 | Pham |
| 2018/0006470 | A1 | 1/2018 | Stacey et al. |
| 2019/0181407 | A1 | 6/2019 | Harris et al. |
| 2021/0298203 | A1 | 9/2021 | Chung et al. |

FOREIGN PATENT DOCUMENTS

| | | | |
|---|---|---|---|
| WO | 2019109162 | A1 | 6/2019 |
| WO | 2021113426 | A1 | 6/2021 |

OTHER PUBLICATIONS

The Phone Talks, "Xiaomi Mi 100W Car Charger," available at <https://www.thephonetalks.com/xiaomi-mi-100w-car-charger-1a1c-review/> web page visited Dec. 19, 2022 (8 pages).

Charger Lab, "Apple 87W USB-C Power Adapter A1719 Teardown Review: the Back of the Drawer," available at <https://www.chargerlab.com/apple-87w-usb-c-power-adapter-a1719-teardown-review-the-back-of-the-drawer/> web bage visited Dec. 19, 2022 (35 pages).

RAV Power, "PD Pioneer 20000mAh 80W AC Portable Power Bank," available at <https://www.ravpower.com/products/rp-pb054-pd-20000mah-80w-ac-portable-charger?gclid=EAlalQobChMI7cma8pz48AIVVx6tBh0x_gWIEAQYASABEgJ6jfD_BwE> web page visited Dec. 19, 2022 (5 pages).

BATTERY CHARGER WITH COOLING AND SEALING CONSTRUCTION

CROSS-REFERENCE TO RELATED APPLICATIONS

The present disclosure claims benefit of U.S. Provisional Patent Application No. 63/289,794 filed Dec. 15, 2021, the entire contents of which are incorporated herein by reference.

FIELD OF THE DISCLOSURE

The present disclosure relates to battery chargers, and more particularly to battery chargers for power tool batteries.

BACKGROUND OF THE DISCLOSURE

Battery packs are becoming ubiquitous on a job site with the advent of cordless power tools. These packs require periodic recharging, but can also be used to charge other electronics, such as cell phones and laptops.

SUMMARY OF THE DISCLOSURE

The present disclosure includes, according to embodiments described herein, a charger for use with a rechargeable battery. The charger includes a housing, electrical components, a connector port, a heatsink, and thermally conductive filler material. The housing includes a battery interface slidably receiving the rechargeable battery. The electrical components are disposed in the housing. The electrical components generate heat. The connector port is electrically coupled to the electrical components. The heatsink is disposed in the housing. The heatsink includes a cavity. The thermally conductive filler material at least partially fills the cavity. The thermally conductive filler material contacts both the electrical components and the heatsink.

The present disclosure includes, according to embodiments described herein, a charger for use with a rechargeable battery. The charger includes a housing, electrical components, a heatsink, and thermally conductive filler material. The housing includes a battery interface slidably receiving the rechargeable battery. The electrical components are disposed in the housing. The electrical components generate heat. The heatsink is disposed in the housing. The thermally conductive filler material is disposed between the heatsink and the electrical components.

The present disclosure includes, according to embodiments described herein, a charger for use with a rechargeable battery. The charger includes a connector port, electrical components, a plurality of terminal fins, thermally conductive filler material, and a heatsink. The connector port receives power. The electrical components are electrically coupled to the connector port. The electrical components generate heat. The plurality of terminal fins is electrically coupled to the electrical components. The terminal fins deliver power to the rechargeable battery. The thermally conductive filler material transfers heat away from the electrical components. The heatsink transfers heat away from the thermally conductive filler material.

Figure 1:
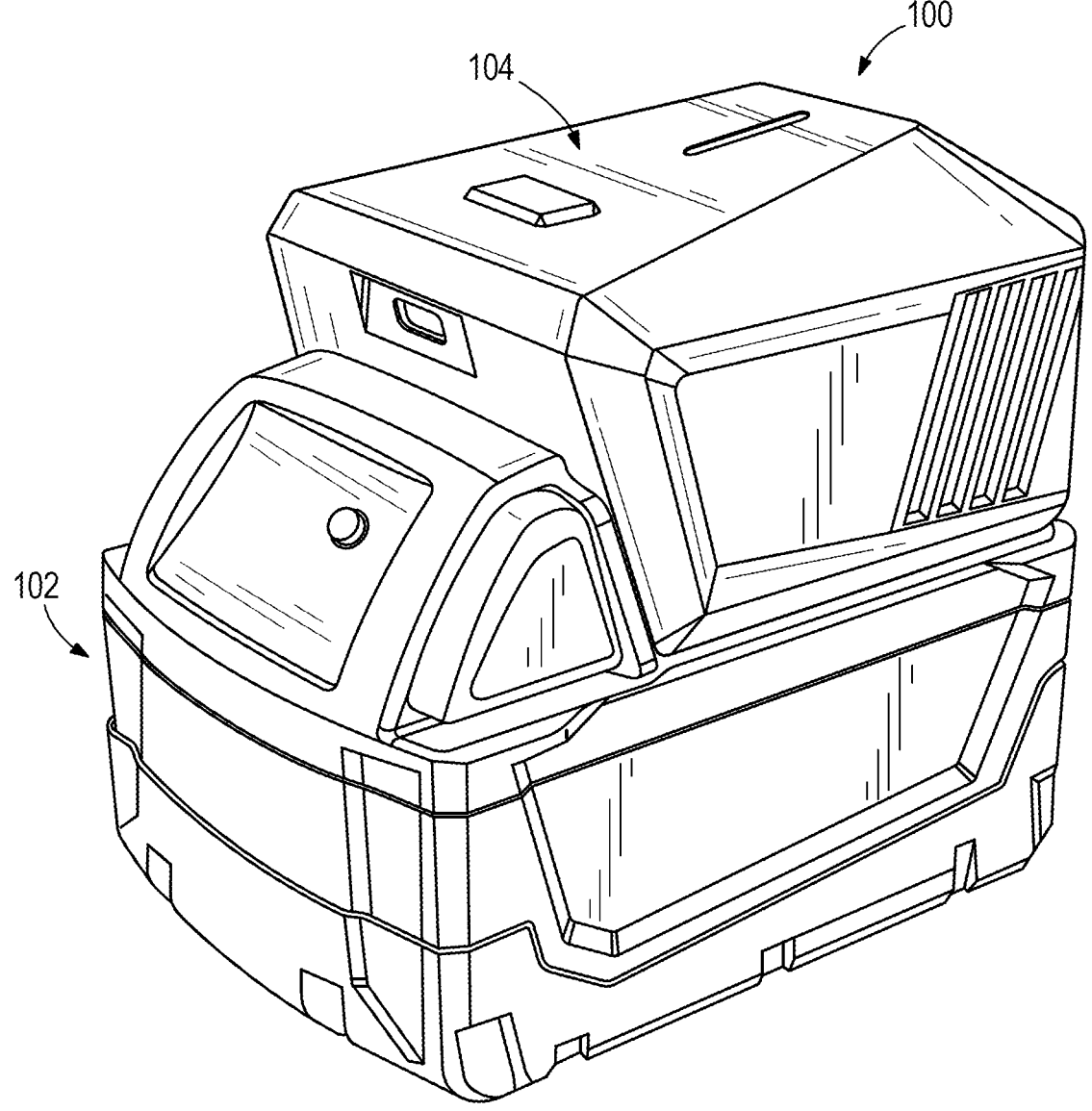
FIG. 1 is a perspective view of a battery charger with a rechargeable battery pack coupled thereto, according to embodiments disclosed herein.

Before any embodiments of the disclosure are explained in detail, it is to be understood that the disclosure is not limited in its application to the details of construction and the arrangement of components set forth in the following description or illustrated in the drawings. The disclosure is capable of other embodiments and of being practiced or of being carried out in various ways. Also, it is to be understood that the phraseology and terminology used herein are for the purpose of description and should not be regarded as limiting.

DETAILED DESCRIPTION

Figures 4, 5:
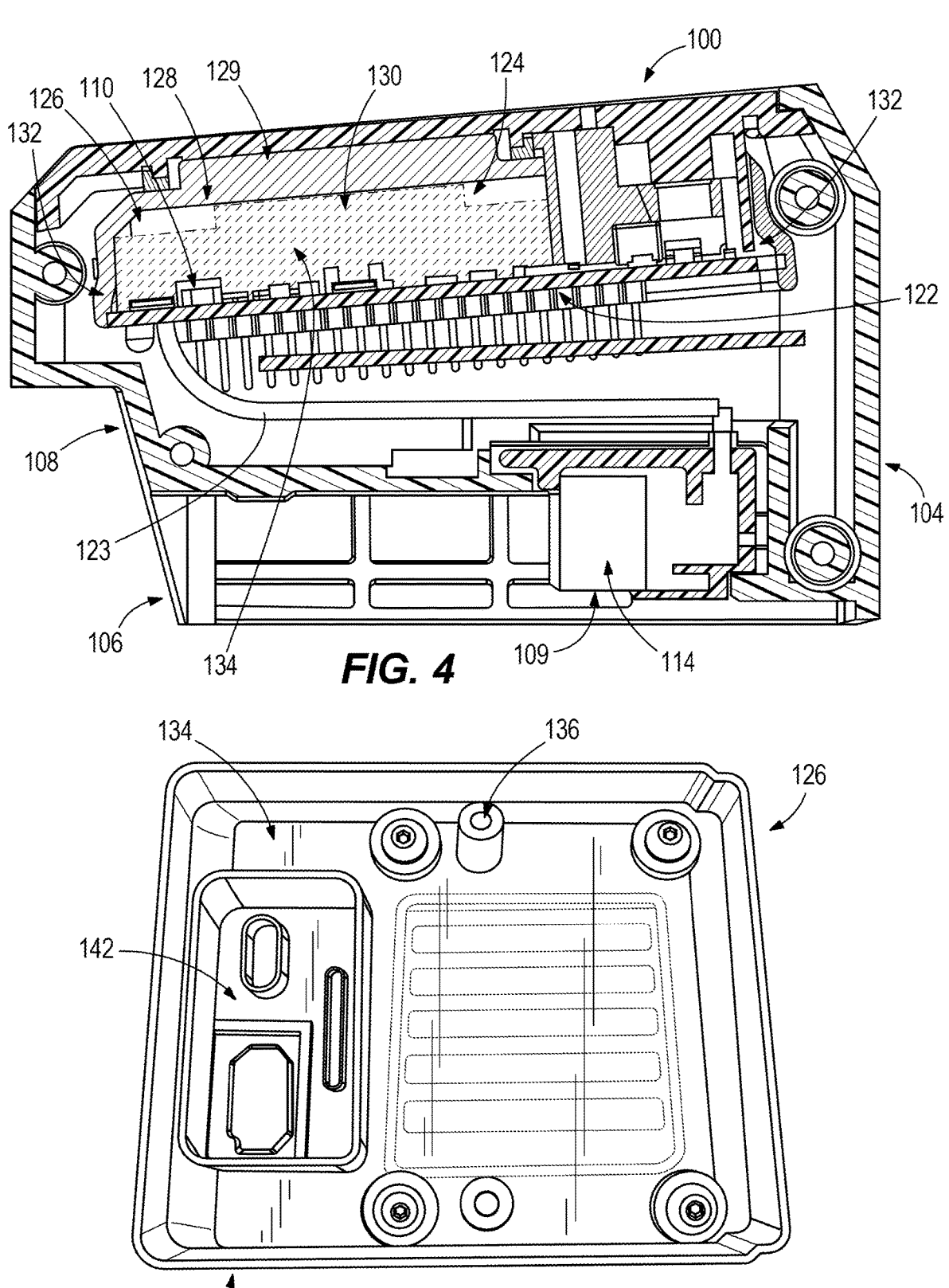
FIG. 4 is a side cross-sectional view of the battery charger of FIG. 2.
FIG. 5 is a bottom perspective view of a heat sink of the battery charger of FIG. 2.

FIG. 1 illustrates a battery charger 100 with a rechargeable battery 102 removably coupled thereto. The battery charger 100 includes a housing 104. The housing 104 includes a battery interface 106 (shown in the embodiment of FIG. 2). The battery interface 106 includes a battery entry end 108 and a terminal end 109 (FIG. 4). A guide rail 112 extends at least partially between the battery entry end 108 and the terminal end 109 over a surface of the battery interface 106. The guide rail 112 allows the rechargeable battery 102 to slidably engage and couple to the battery charger 100.

Referring to FIG. 4, the terminal end 109 of the battery interface 106 includes a plurality of terminal fins 114 configured to electrically couple with corresponding terminals of the rechargeable battery 102. The rechargeable battery 102 may include a track/slot (not shown) configured to receive the guide rail 112 of the battery interface 106. The rechargeable battery 102 slides along the guide rail 112 until the terminals of the rechargeable battery 102 contact the terminal fins 114 of the charger 100 in an installed position. As shown in FIG. 1, the rechargeable battery 102 supports the charger 100 in the installed position.

Figure 2:
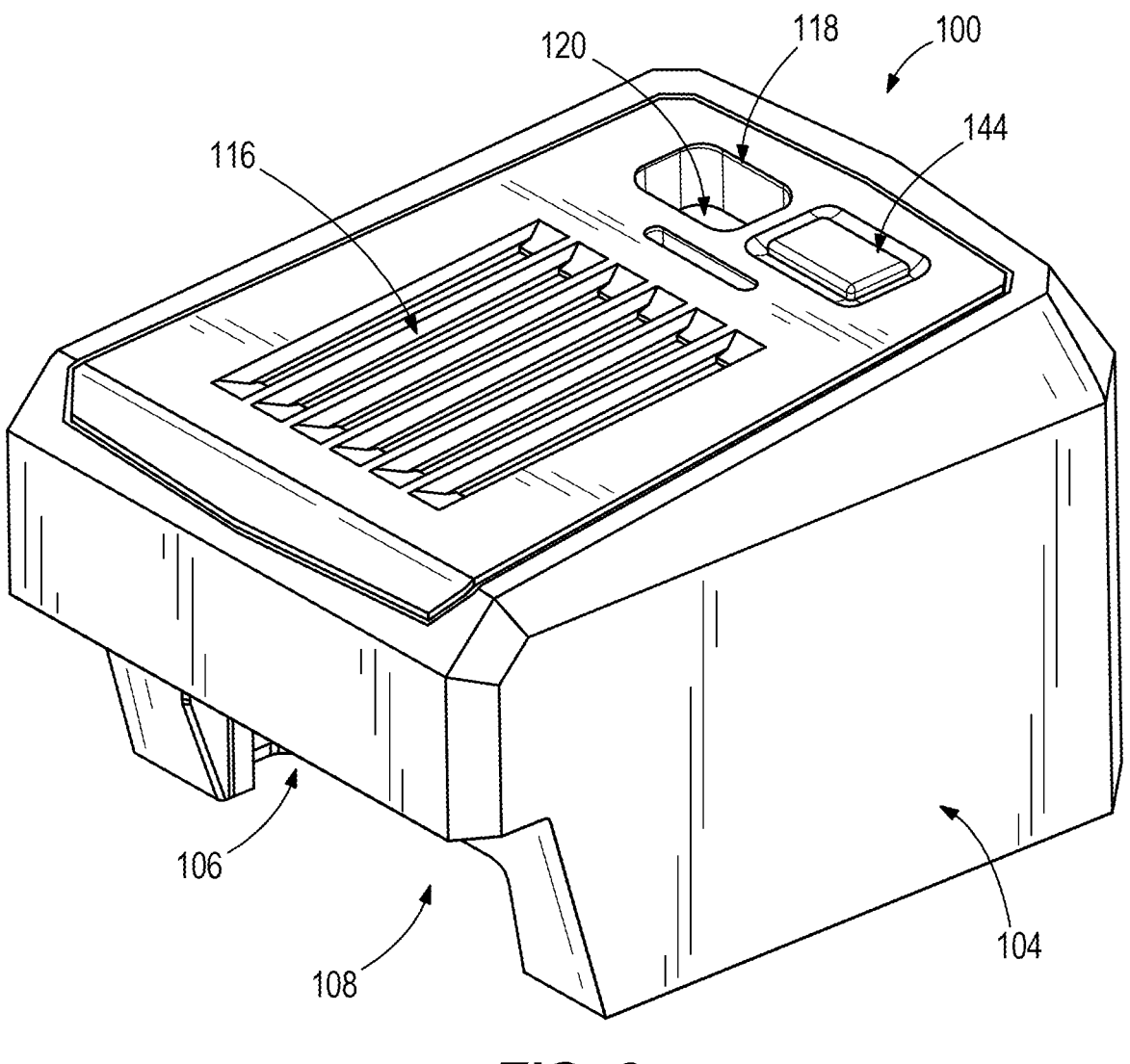
FIG. 2 is a perspective view of another battery charger, according to embodiments disclosed herein.
Figure 3:
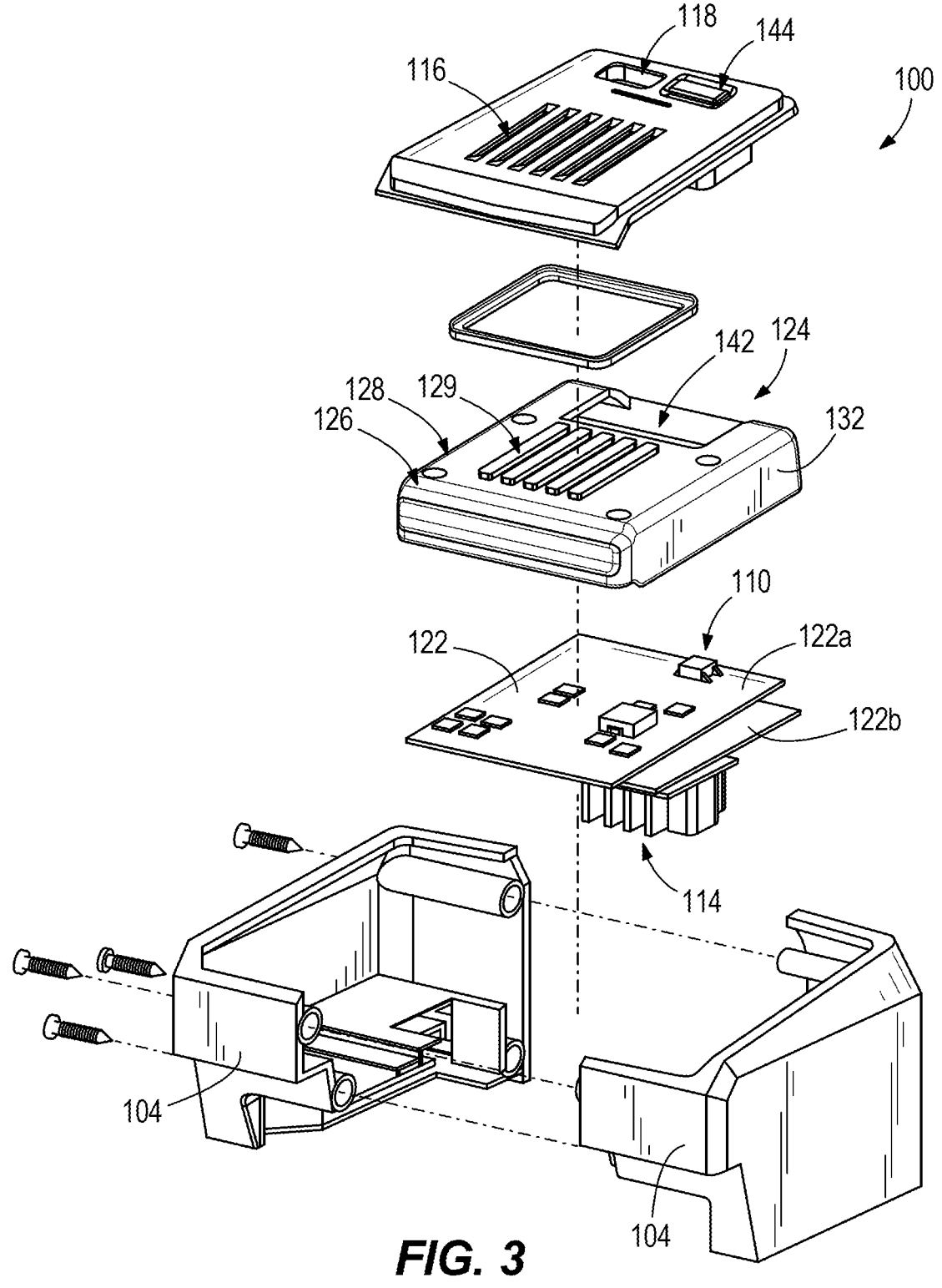
FIG. 3 is an exploded view of the battery charger of FIG. 2.

FIG. 2 illustrates another variation/embodiment of the battery charger 100 with the rechargeable battery 102 removed. As shown in FIGS. 3 and 4, the housing 104 defines an interior volume configured to house electrical components 110. The housing 104 also includes a vent 116 and a port aperture 118. The vent 116 defines an opening through the housing 104 such that an interior volume of the housing 104 and an ambient environment outside the charger 100 are in fluid communication. The port aperture 118 is a receptacle for a charging cable such as a USB cable (not shown). The port aperture 118 provides access to a connector port 120 (FIG. 2) through the housing 104. In the illustrated embodiment, the port aperture 118 is defined in the housing 104 opposite the terminal fins 114. In other embodiments, the port aperture 118 can have a different position relative to the terminal fins 114.

The housing 104, as shown in FIGS. 3 and 4, houses the electrical components 110 within the interior volume. The electrical components 110 are disposed on at least one printed circuit board 122. As shown in the exploded view of the charger 100 in FIG. 3, the circuit board 122 includes a power printed circuit board assembly (PCBA) 122*a* and a control PCBA 122*b*. The electrical components 110 include the connector port 120 configured to couple with the charging cable. In the illustrated embodiment, the connector port 120 is a Universal Standard Bus port (USB port) configured as a five-volt power source. The terminal fins 114 are electrically coupled with the circuit board 122. In the illustrated embodiment, the connector port 120 is located on a first side of the circuit board 122 and the terminal fins 114 are electrically coupled a second side of the circuit board 122. The terminal fins 114 are connected to the electrical components 110 on the circuit board 122 by at least one wire 123. In the installed battery position, the electrical components 110 are configured to selectively supply power to and/or distribute power from the rechargeable battery 102.

Referring to FIGS. 3 and 4, the charger 100 also includes thermal distribution components 124 configured to dissipate heat generated by the electrical components 110 on the circuit board 122. As shown in FIG. 4, the thermal distribution components 124 include a heatsink 126 and thermally conductive filler material 130 surrounding at least a portion of the electrical components 110. The heatsink 126 and thermally conductive filler material 130 cooperate to conduct and dissipate heat from the electrical components 110 on the circuit board 122.

The heatsink 126 includes a main body 128 extending generally parallel to the circuit board 122. The heatsink 126 can include a plurality of fins 129 protruding from an outer surface of the main body 128. As shown in FIG. 4, the plurality of fins 129 project in an outward direction, away from the interior cavity of the charger 100. The fins 129 can be positioned to protrude between slats in the vent 116 and are configured to increase heat transfer through an increased surface area. As shown in FIG. 4, heatsink 126 further includes sidewalls 132 extending between an inner surface of the main body 128 and the circuit board 122 to define a cavity 134 in heatsink 126.

Referring to FIG. 5, the heatsink 126 may include at least one boss 136 configured to receive a mechanical fastener 138. The circuit board 122 may include at least one aperture (not shown) extending therethrough and corresponding to the at least one boss 136. The at least one boss 136, the mechanical fastener 138 (shown in FIG. 7), and the at least one aperture cooperate to couple the circuit board 122 to the heatsink 126.

As shown in FIG. 4, the thermally conductive filler material 130 is disposed in the housing 104 within the cavity 134 of the heatsink 126. The electrical components 110 are disposed on the circuit board 122 and protrude from the circuit board 122 at varying heights. In the illustrated embodiment, the thermally conductive filler material 130 fills the entire cavity 134 between the main body 128 of the heatsink 126 and the circuit board 122 such that the thermally conductive filler material 130 is in contact with both the heatsink 126 and the circuit board 122. In other embodiments, the thermally conductive filler material 130 may partially fill the cavity 134 such that the thermally conductive filler material 130 contacts the circuit board 122 and sidewalls 132, but not the main body 128 of the heatsink.

Figure 6:
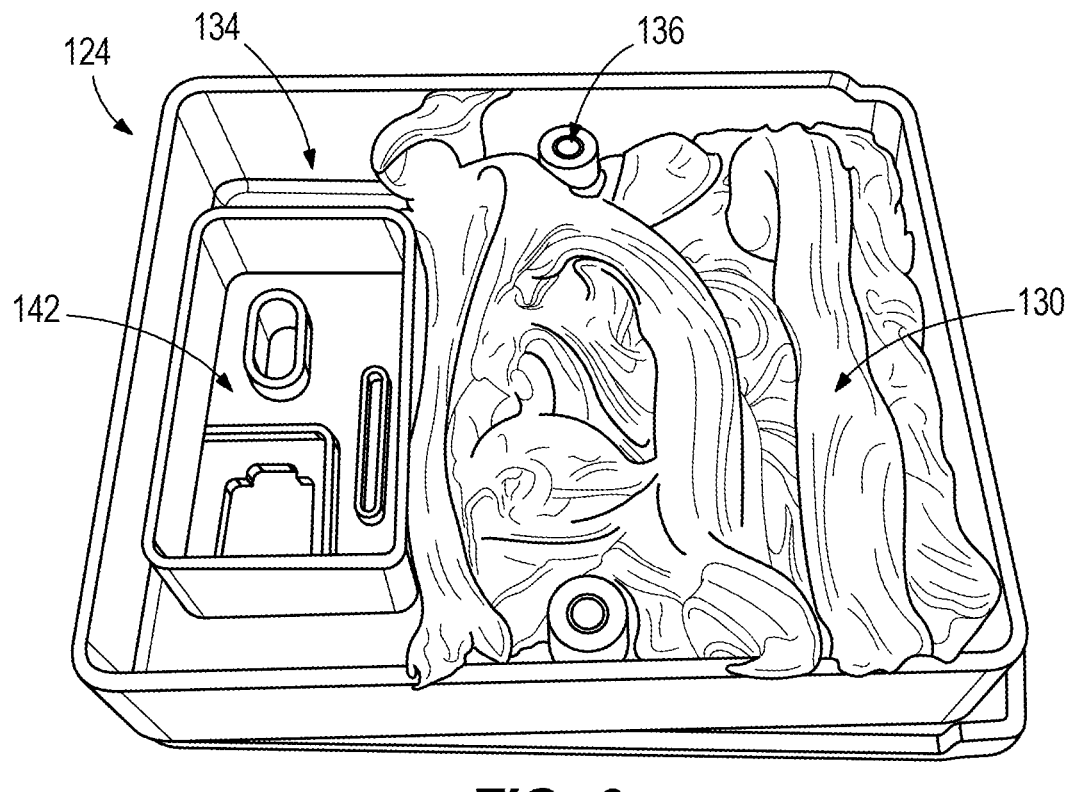
FIG. 6 is a bottom perspective view of the heat sink of FIG. 5 filled with thermally conductive filler material.
Figure 7:
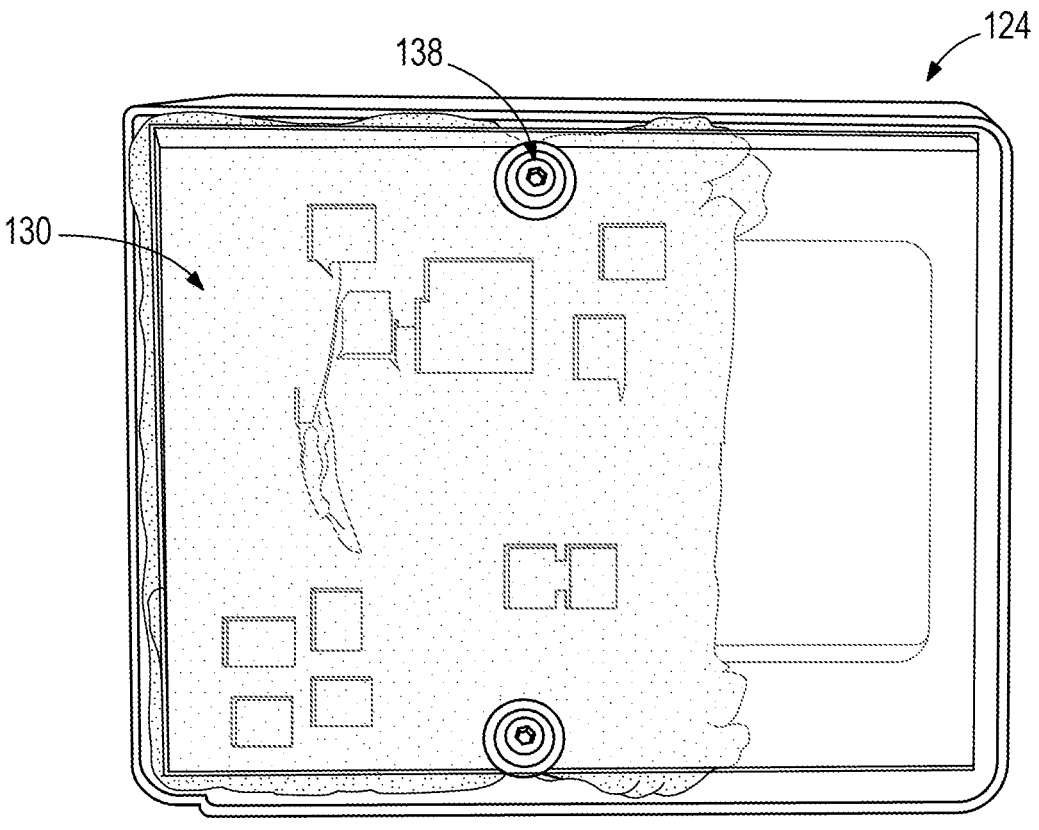
FIG. 7 is a bottom perspective view of a negative imprint of a circuit board in the thermally conductive filer material of FIG. 6.

Referring to FIG. 6, the thermally conductive filler material 132 is soft or malleable (at least temporarily) to fill air gaps between the circuit board 122 and the main body 128 of the heatsink 126. FIG. 7 shows the negative impression of the circuit board 122 and electrical components 110 with the circuit board 122 removed. The thermally conductive filler material 130 can be a paste, a gel, a grease, a powder, or a putty. In some embodiments, the thermally conductive filler material 130 may harden or cure after a time.

Referring to FIGS. 3 and 6-7, the heatsink 126 includes a user interface portion 142 located between the port aperture 118 and a power switch 144 on the housing 104 and the circuit board 122. The thermally conductive filler material 130 is disposed in the cavity 134 rearward of the user interface portion 142, such that thermally conductive filler material 130 contacts a majority of the circuit board 122 in a longitudinal direction. In other embodiments, the thermally conductive filler material 130 may cover a smaller or larger portion of the circuit board 122.

The electrical components 110 of the charger 100 operate in a battery recharge mode, in which the rechargeable battery 102 is charged, and a power delivery mode, in which the rechargeable battery 102 supplies power to an external device. In the battery recharge mode, the rechargeable battery 102 is slidably received within the battery interface 106 of the charger 100. A first end of the charging cable received by the connector port 120, and a second end of the charging cable is connected to a power supply (such as mains electricity). The rechargeable battery 102 is charged by the power supply. In some embodiments, the second end of the charging cable is a wall adapter for an electrical outlet. In the power delivery mode, the rechargeable battery 102 is slidably received within the battery interface 106 of the charger 100. The first end of the charging cable is received by connector port 120, and the second end of the charging cable is received by the external device. The rechargeable battery 102 supplies power to the external device.

In operation (e.g., battery recharge mode and power delivery mode), the electrical components 110 generate resistive heat within the housing 104. The thermally conductive filler material 132, which contacts the electrical components 110, and the heatsink 126 conduct heat away from the electrical components 110. The thermally conductive filler material 130 conducts and dissipates heat more efficiently than air. The heatsink 126 and thermally conductive filler material 130 also remove more heat from the electrical components 110 than the heatsink 126 alone.

Various features of the disclosure are set forth in the following claims.

What is claimed is:

1. A charger for use with a rechargeable battery, the charger comprising:
a housing including a battery interface including a battery entry end and a plurality of terminals opposite the battery entry end, the battery interface configured to slidably receive the rechargeable battery;
a plane passing through the battery entry end and the plurality of terminals, a majority of the charger disposed on one side of the plane;
electrical components disposed in the housing, the electrical components configured to generate heat;
a connector port electrically coupled to the electrical components;
a heatsink disposed in the housing, the heatsink including a cavity defined therein; and
thermally conductive filler material at least partially filling the cavity, the thermally conductive filler material contacting both the electrical components and the heatsink; and
wherein the charger is configured to be supported by the rechargeable battery in a stack direction with the rechargeable battery in the installed position, the plane being perpendicular to the stack direction.

2. The charger of claim 1, further comprising a circuit board, and wherein the electrical components are disposed on the circuit board.

3. The charger of claim 2, wherein the thermally conductive filler material contacts the circuit board.

4. The charger of claim 3, wherein the thermally conductive filler material contacts a majority of a side of the circuit board.

5. The charger of claim 2, wherein the plurality of terminals includes a plurality of terminal fins, and the terminal fins are on an opposite side of the circuit board from the connector port.

6. The charger of claim 5, wherein the terminal fins are electrically coupled to the electrical components by at least one wire.

7. The charger of claim 1, wherein the heatsink surrounds at least a portion of the electrical components.

8. The charger of claim 1, wherein the connector port is on an opposite side of the housing from the battery interface.

9. The charger of claim 1, wherein the heatsink includes a plurality of heatsink fins.

10. The charger of claim 1, wherein the connector port includes a USB port.

11. The charger of claim 1, wherein the connector port is configured to selectively deliver power from the rechargeable battery in a power delivery mode and to the rechargeable battery in a recharge mode.

12. The charger of claim 1, wherein the thermally conductive filler material fills a majority of the cavity.

13. A charger for use with a rechargeable battery, the charger comprising:

a housing including a battery interface configured to slidably receive the rechargeable battery such that the charger is configured to be supported by the rechargeable battery in a stack direction, the battery interface including a guide rail extending perpendicular to the stack direction;

electrical components disposed in the housing, the electrical components configured to generate heat;

a heatsink disposed in the housing; and thermally conductive filler material disposed between the heatsink and the electrical components.

14. The charger of claim 13, wherein the heatsink and the circuit board are coupled to each other with at least one fastener.

15. The charger of claim 13, wherein the heatsink and the circuit board cooperate to define a cavity, a majority of the cavity filled with the thermally conductive filler material.

16. A charger for use with a rechargeable battery, the charger comprising:

a connector port configured to receive power;

electrical components electrically coupled to the connector port, the electrical components configured to generate heat;

a terminal fin electrically coupled to the electrical components, the terminal fin configured to deliver power to the rechargeable battery and lying in a terminal plane;

thermally conductive filler material configured to transfer heat away from the electrical components; and a heatsink configured to transfer heat away from the thermally conductive filler material; and wherein the charger is configured to be supported by the rechargeable battery in a stack direction, the terminal plane extending parallel to the stack direction.

17. The charger of claim 16, wherein the connector port is further configured to deliver power to an external device.

* * * * *